(12) United States Patent
Huang et al.

(10) Patent No.: US 12,414,344 B2
(45) Date of Patent: Sep. 9, 2025

(54) SEMICONDUCTOR DEVICE HAVING ACTIVE REGIONS OF DIFFERENT DIMENSIONS AND METHOD OF MANUFACTURING THE SAME

(71) Applicant: TAIWAN SEMICONDUCTOR MANUFACTURING COMPANY LTD., Hsinchu (TW)

(72) Inventors: Ching-Yu Huang, Hsinchu (TW); Wei-Cheng Tzeng, Taipei (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 508 days.

(21) Appl. No.: 17/813,641

(22) Filed: Jul. 20, 2022

(65) Prior Publication Data

US 2024/0030290 A1    Jan. 25, 2024

(51) Int. Cl.
*H10D 62/17*    (2025.01)
*H10D 30/01*    (2025.01)
*H10D 64/27*    (2025.01)

(52) U.S. Cl.
CPC ......... *H10D 62/292* (2025.01); *H10D 30/023* (2025.01); *H10D 62/393* (2025.01); *H10D 64/511* (2025.01)

(58) Field of Classification Search
CPC .. H10D 62/292; H10D 30/023; H10D 62/393; H10D 12/01; H10D 84/0135–0142; H10D 84/0172–0179; H10D 64/311–519; H10D 62/364
See application file for complete search history.

(56) References Cited

U.S. PATENT DOCUMENTS

| | | | |
|---|---|---|---|
| 2011/0235407 A1* | 9/2011 | Lim ....................... | H10B 10/12 257/E23.141 |
| 2018/0204795 A1* | 7/2018 | Smayling ........... | H10D 84/0135 |

\* cited by examiner

*Primary Examiner* — Shahed Ahmed
(74) *Attorney, Agent, or Firm* — WPAT LAW; Anthony King

(57) ABSTRACT

The present disclosure provides a semiconductor device and a method of manufacturing the same. The semiconductor device includes a substrate, a first active region disposed on the substrate, a first gate structure disposed on the first active region, and a second gate structure disposed on the first active region and spaced apart from the first gate structure. The first active region includes a first portion and a second portion, the first portion of the first active region and the second portion of the first active region collectively specify a first stair profile. The first stair profile is located between the first gate structure and the second gate structure from a top view.

20 Claims, 15 Drawing Sheets

SEMICONDUCTOR DEVICE HAVING ACTIVE REGIONS OF DIFFERENT DIMENSIONS AND METHOD OF MANUFACTURING THE SAME

BACKGROUND

With the rapid growth of the electronics industry, the development of integrated circuits (ICs) has achieved high performance and miniaturization. Technological advances in IC materials and design have produced generations of ICs in which each generation has smaller and more complex circuits than the previous generation. Transistors are commonly used as fundamental construction building blocks for ICs, and the dimension of the active regions of a transistor may have influence on the performance (e.g., speed, power consumption, and current leakage) of the manufactured ICs. In most market-available IC designs, the dimension of active regions is made uniform, resulting in constraints on performance.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1A:
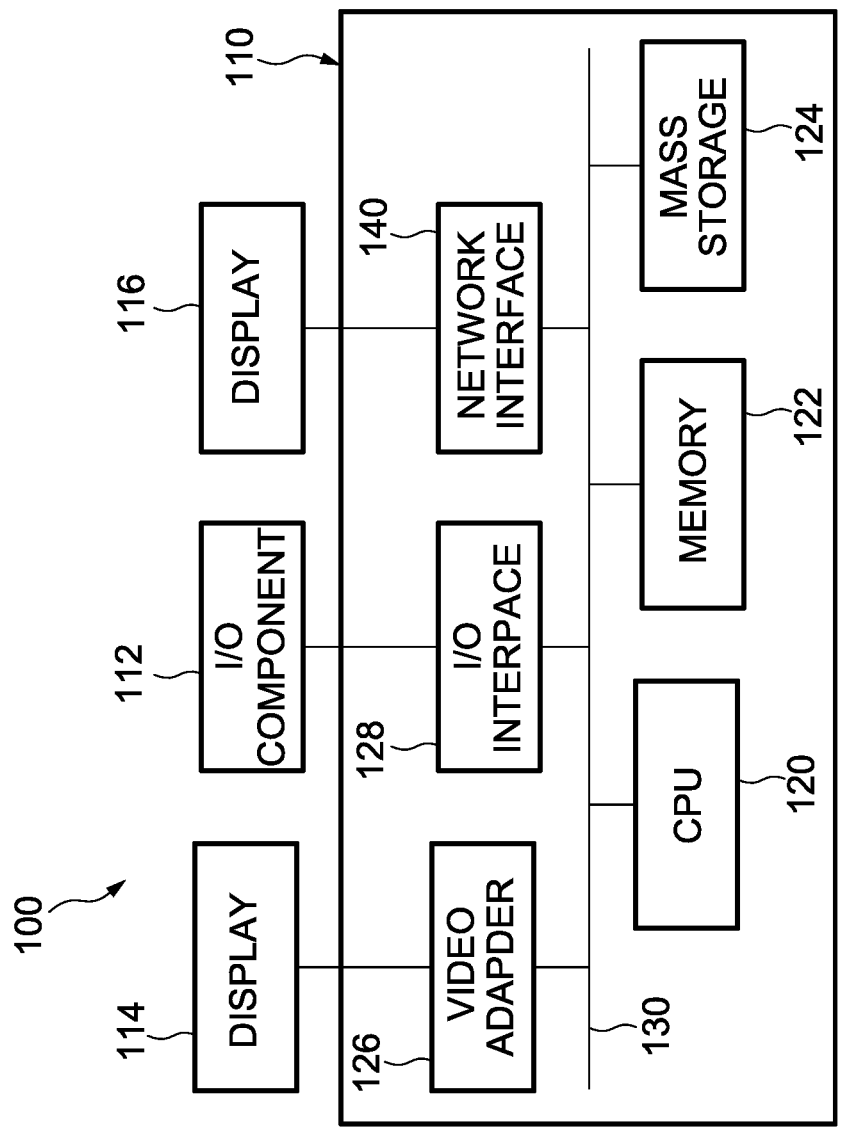
FIG. 1A is a block diagram of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1A is a block diagram of a processing system in accordance with some embodiments.

Referring to FIG. 1A, a block diagram of a processing system 100, such as an electronic design automation (EDA) processing system, is provided in accordance with an embodiment. The processing system 100 is a general purpose computer platform and may be used to implement any or all of the processes discussed herein or a dedicated computer platform for performing electronic design. The processing system 100 may comprise a processing unit 110, such as a desktop computer, a workstation, a laptop computer, or a dedicated unit customized for a particular application. The processing system 100 may be equipped with a display 114 and one or more input/output devices 112, such as a mouse, a keyboard, or printer. The processing unit 110 may include a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, such as a microprocessor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, or the like.

The video adapter 126 and the I/O interface 128 provide interfaces to couple external input and output devices to the processing unit 110. As illustrated in FIG. 1A, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

It can be contemplated that the processing system 100 may include additional components. For example, the processing system 100 may include power supplies, cables, a motherboard, removable storage media, cases, and the like. These other components, although not shown, are considered part of the processing system 100.

Figure 1B:
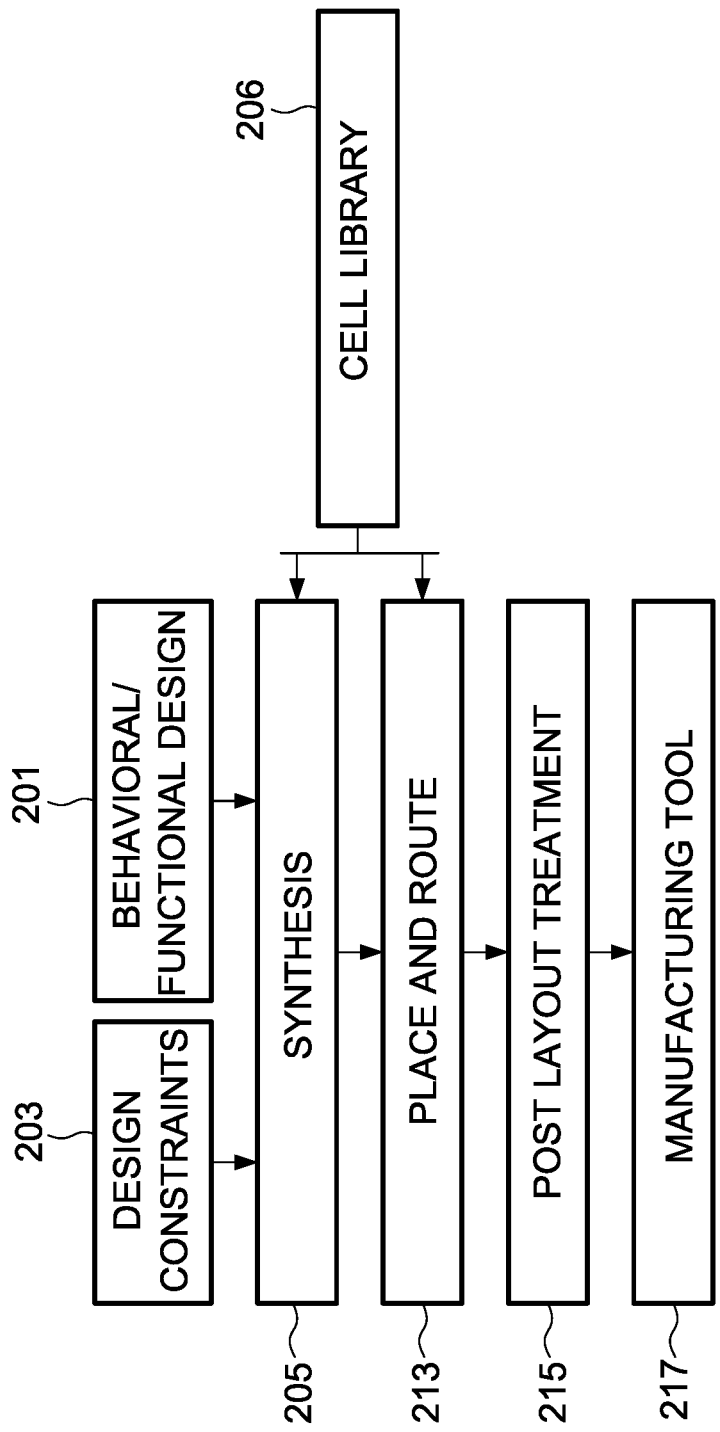
FIG. 1B is a flowchart used by an electronic design automation system in accordance with some embodiments.

In an embodiment, an EDA is program code that is executed by the CPU 120 to analyze a user file to obtain an integrated circuit layout (described further with respect to FIG. 1B). Further, during the execution of the EDA, the EDA may analyze functional components of the layout. The program code may be accessed by the CPU 120 via the bus 130 from the memory 122, mass storage device 124, or the like, or remotely through the network interface 140.

FIG. 1B illustrates one possible flow used by the EDA in an embodiment to automatically generate a physical layout from a user supplied behavioral/functional design 201. The behavioral/functional design 201 specifies the desired behavior or function of the circuit based upon various signals or stimuli applied to the inputs of the overall design, and may be written in a suitable language, such as a hardware description language (HDL). The behavioral/functional design 201 may be uploaded into the processing unit 110 (see FIG. 1A) through the I/O interface 128, such as by a user creating the file while the EDA is executing. Alternatively, the behavioral/functional design 201 may be uploaded and/or saved on the memory 122 or mass storage device 124, or the behavioral/functional design 201 may be uploaded through the network interface 140 from a remote user (see FIG. 1A). In these instances, the CPU 120 will access the behavioral/functional design 201 during execution of the EDA.

Additionally, the user also provides a set of design constraints 203 in order to guide the overall design of the physical layout of the behavioral/functional design 201. The design constraints 203 may be input, for example, through the I/O interface 128, downloaded through the network interface 140, or the like. The design constraints 203 may specify timing and other suitable constraints for the behavioral/functional design 201, once physically formed into an integrated circuit, to comply.

The EDA uses the behavioral/functional design 201 and the design constraints 203 and performs a synthesis 205 to create a functionally equivalent logic gate-level circuit description, such as a netlist. The synthesis 205 forms the functionally equivalent logic gate-level circuit description by matching the behavior and/or functions desired from the behavioral/functional design 201 to standard cells from cell libraries 206, which meet the design constraints 203.

The cell libraries 206 may include one or more individual cell libraries. Each of the individual cell libraries contains a listing of pre-designed components, or cells, each of which may perform a discrete logic function on a small scale. The cell is stored in the individual cell libraries as information comprising internal circuit elements, the various connections to these circuit elements, a pre-designed physical layout pattern that includes the height of each cell along with the cells' designed power rails, dopant implants, wells, and the like. Additionally, the stored cell may also comprise a shape of the cell, terminal positions for external connections, delay characteristics, power consumption, and the like.

Once the synthesis 205 creates the functionally equivalent logic gate-level circuit description from the behavioral/functional design 201 and the design constraints 203 by using one or more of the cell libraries 206, a place and route 213 is performed to create an actual physical design for the overall structure. The place and route 213 forms the physical design by taking the chosen cells from the cell libraries 206 and placing them into cell rows. The placement of each individual cell within the cell rows, and the placement of each cell row in relation to other cell rows, may be guided by cost functions in order to minimize wiring lengths and area requirements of the resulting integrated circuit. This placement may be performed either automatically by the place and route 213, or alternatively partly through a manual process, whereby a user may manually insert one or more cells into a row.

After the initial placement of the individual cells, a post layout treatment 215 is performed. In an embodiment the post layout treatment 215 is a treatment that occurs after the placement of the individual cells and is a treatment which analyzes the vias along the abutments between the individual cells and modifies these vias along the abutment in order to overcome restraints related to the physical limitations of lithography processes and which help generate a higher density cell.

Once a physical design layout has been generated by the place and route 213 and the post layout treatment 215 has occurred, the physical design may be sent to a manufacturing tool 217 to generate, e.g., photolithographic masks, that may be used in the physical manufacture of the desired design. The physical design layout may be sent to the manufacturing tool 217 through that LAN/WAN 166 or other suitable forms of transmission from the EDA to the manufacturing tool 217.

Figure 2A:
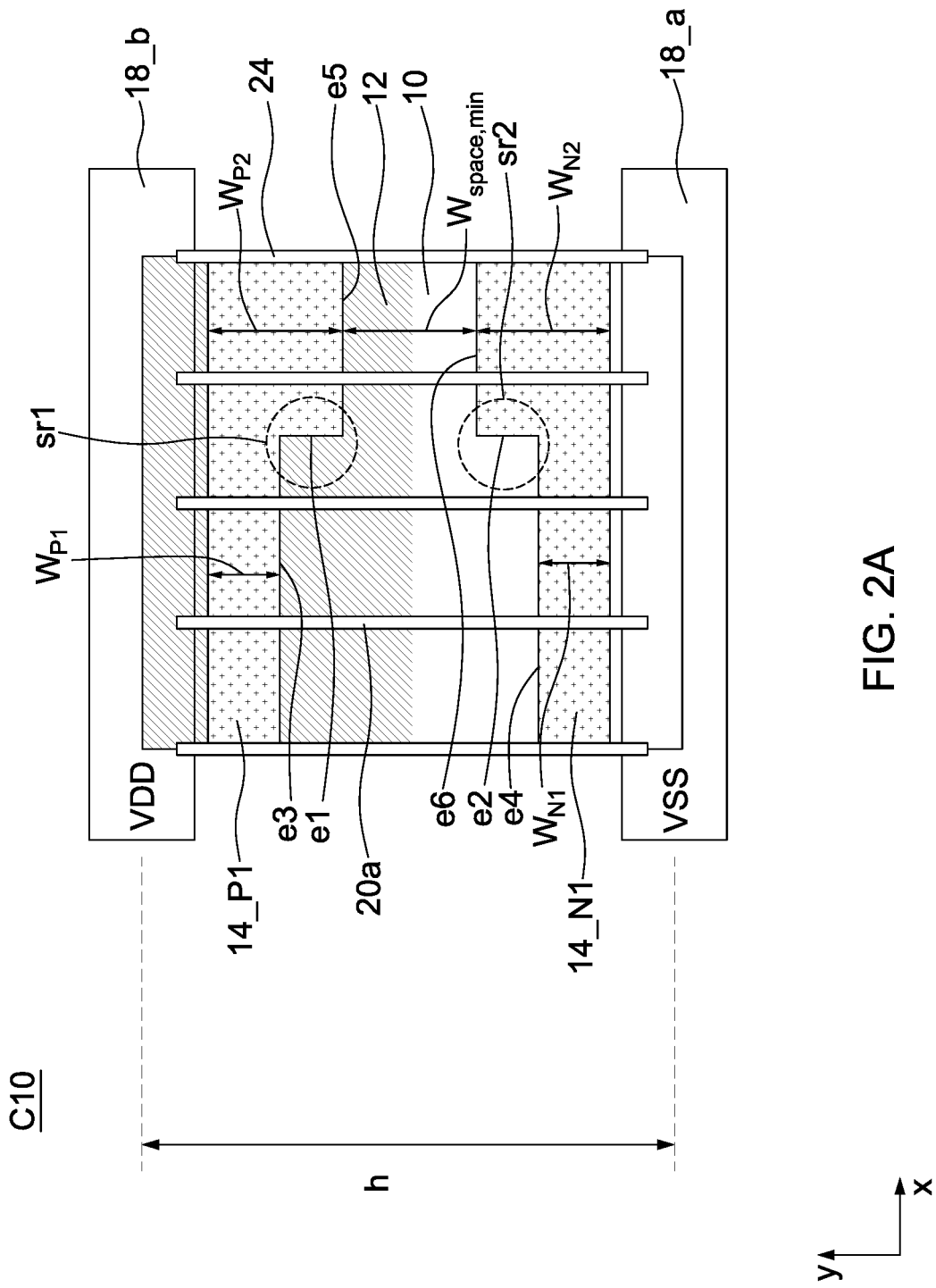
FIG. 2A illustrates a single cell in accordance with some embodiments.

FIG. 2A illustrates a single cell C10 in accordance with some embodiments that may be stored in the cell libraries 206. The cell C10 is a single-height cell with a height h. The cell C10 includes a substrate 10 and a well region 12. The cell C10 further includes active regions 14_P1 and 14_N1 on the substrate 10. Several gate structures 20a are disposed in parallel on the active regions 14_P1 and 14_N1. Several isolation structures 24 are disposed on the left and right sides of the cell C10. Conductive patterns 18_a and 18_b are disposed horizontally. The conductive patterns 18_a and 18_b are configured to be electrically connected to power source(s) and to receive, for example, voltages VDD and VSS. The single cell C10 is a layout representation for a portion of a semiconductor device. The gate structures 20a and the isolation structures 24 can also be referred to as gate patterns 20a and isolation patterns 24.

In some embodiments, the substrate 10 is a semiconductor substrate, such as a bulk semiconductor, a semiconductor-on-insulator (SOI) substrate, or the like, which is doped (e.g., with a P-type or an N-type dopant) or undoped. In some embodiments, the substrate 10 is a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 includes silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, or combinations thereof.

According to a conductivity type of the transistors to be formed, a conductivity type of the well region 12 can be P type or N type. In some embodiments, the well region 12 is an N-type doping region and includes an N-type dopant. The dopant of the well region 12 may have an atomic number greater than 20 in order to avoid diffusion of the dopants and expansion of the well region 12 after an annealing operation. In some embodiments, the dopant of the well region 12 includes arsenic (As). In other embodiments, antimony (Sb), bismuth (Bi), other suitable N-type dopants, or a combination thereof is used to form the well region 12. In other embodiments, the well region 12 is a P-type doping region and includes a P-type dopant. In some embodiments, the dopant of the well region 12 has an atomic number greater than 20. In some embodiments, gallium (Ga), indium (in), other suitable P-type dopants, or a combination thereof is used to form the well region 12.

In some embodiments, each of the active regions 14_P1 and 14_N1 is a region with a semiconductor surface wherein various doped features are formed and configured to one or more device, such as a diode, a transistor, and/or other suitable devices. The active regions 14_P1 and 14_N1 can have different conductivity type. In some embodiments, a conductivity type of the active regions 14_P1 can be P type or N type. In some embodiments, a conductivity type of the active regions 14_P2 can be P type or N type.

In some embodiments, each of the isolation structures 24 is disposed on a cell edge of the cell C10 to electrically isolate the cell C10 from other cells. The isolation structure 24 can also be referred to as an isolation dummy gate.

An isolation dummy gate is a dielectric structure that includes one or more dielectric materials and functions as an electrical isolation structure. Accordingly, an isolation dummy gate is not electrically conductive and thus does not function, e.g., as an active gate of a transistor. An isolation dummy gate includes one or more dielectric materials and functions as an electrical isolation structure. In some embodiments, an isolation dummy gate is based on a gate structure as a precursor. In some embodiments, a dummy gate structure includes a gate conductor, a gate-insulator layer, (optionally) one or more spacers, or the like. In some embodiments, an isolation dummy gate is formed by first forming a gate structure, e.g., a dummy gate structure, sacrificing/removing (e.g., etching) the gate conductor of the gate structure to form a trench, (optionally) removing a portion of a substrate that previously had been under the gate conductor to deepen the trench, and then filling the trench with one or more dielectric materials such that the physical dimensions of the resultant electrical isolation structure, i.e., the isolation dummy gate, are similar to the dimensions of the dummy gate conductor which was sacrificed, namely the gate conductor or the combination of the gate conductor and the portion of the substrate. In some embodiments, each of the isolation structures 24 is a dielectric feature that includes one or more dielectric materials (e.g., oxide, nitride, oxynitride, or other suitable materials), and functions as an isolation feature. The isolation structures 24 extend along a Y-axis. In some embodiments, each of the isolation structures 24 is a continuous polysilicon on oxide diffusion (OD) edge structure, and is referred to as a CPODE structure.

In some embodiments, each of the isolation structures 24 cuts or disconnects an active region such that the active regions which are disposed on two opposite sides of the isolation dummy gate can be regarded as discontinuous or separated from each other. In some embodiments, each of the isolation structures 24 is formed by cutting a doped region of a substrate and replacing the cut portion with dielectric material(s). In some embodiments which implement FinFET technology, each of the isolation structures 24 is formed by cutting a portion of a fin structure and replacing the cut portion with dielectric material(s).

Each of the gate structures 20a includes a gate dielectric layer (not shown) and a gate electrode layer (not shown) disposed on the gate dielectric layer. The gate dielectric layer includes silicon oxide (SiOx), silicon nitride (SixNy), silicon oxynitride (SiON), or a combination thereof. The gate dielectric layer includes dielectric material(s), such as high-k dielectric material. The high-k dielectric material has a dielectric constant (k value) greater than 4. The high-k material includes hafnium oxide (HfO2), zirconium oxide (ZrO2), lanthanum oxide (La2O3), yttrium oxide (Y2O3), aluminum oxide (Al2O3), titanium oxide (TiO2) or another applicable material. Other suitable materials are within the contemplated scope of the disclosure.

The gate electrode layer is made of conductive material, such as aluminum (Al), copper (Cu), tungsten (W), titanium (Ti), tantalum (Ta), or other applicable materials. In some embodiments, the gate electrode layer includes a work function layer. The work function layer is made of metal material, and the metal material includes N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

Referring to FIG. 2A, the active region 14_P1 includes portions of different dimensions. In some embodiments, the active region 14_P1 includes a first portion of width $W_{P1}$ and a second portion of width $W_{P2}$. The two portions of the active region 14_P1 define a stair profile sr1. The stair profile sr1 can also be referred to as a step profile or a discontinuity profile. The stair profile sr1 includes a rising edge e1 that connects two horizontal edges e3 and e5 of the stair profile sr1. In some embodiments, the rising edge e1 can be in the middle of two adjacent gate structures. In some embodiments, the distances between the rising edge e1 and its two neighboring gate structures are substantially the same.

In existing techniques, a step profile of an active region may be found near an isolation structure. That is, the rising edge of a step profile may be aligned with an isolation structure. However, the usage of an isolation structure within a cell is limited, since the isolation structure will inevitably occupy the available area within a cell. As the manufacturing process evolves, a step profile of an active region can be disposed between gate structures, and thus the usage of non-uniform active regions can be increased. The benefits that can be brought by the usage of non-uniform active regions will be discussed throughout the present disclosure.

Similarly, the active region 14_N1 includes portions of different dimensions. In some embodiments, the active region 14_N1 includes a first portion of width $W_{N1}$ and a second portion of width $W_{N2}$. The two portions of the active region 14_N1 define a stair profile sr2. The stair profile sr2 can also be referred to as a step profile or a discontinuity profile. The stair profile sr2 includes a rising edge e2 that connects two horizontal edges e4 and e6 of the stair profile sr2. In some embodiments, the rising edge e2 can be in the middle of two adjacent gate structures. In some embodiments, the distances between the rising edge e2 and its two neighboring gate structures are substantially the same.

Some comparisons between the cell C10 and a cell with uniform active regions are as follows. For a single-height cell with uniform active regions (i.e., each of the active regions has a uniform width, without any stair profile), the width (e.g., along the Y-axis from the top view) of the active region is specified by a limit, for example, $W_{sh, max}$. As a comparison, for the cell C10 in the present disclosure, the maximum width of the active region can be greater than $W_{sh, max}$. In some embodiments, the widths $W_{P2}$ and $W_{N2}$ can be greater than $W_{sh, max}$. However, the minimum space between adjacent active regions is specified by a limit, for example, $W_{space, min}$, so as to avoid Shallow Trench Isolation (STI) stress effects.

Figure 2B:
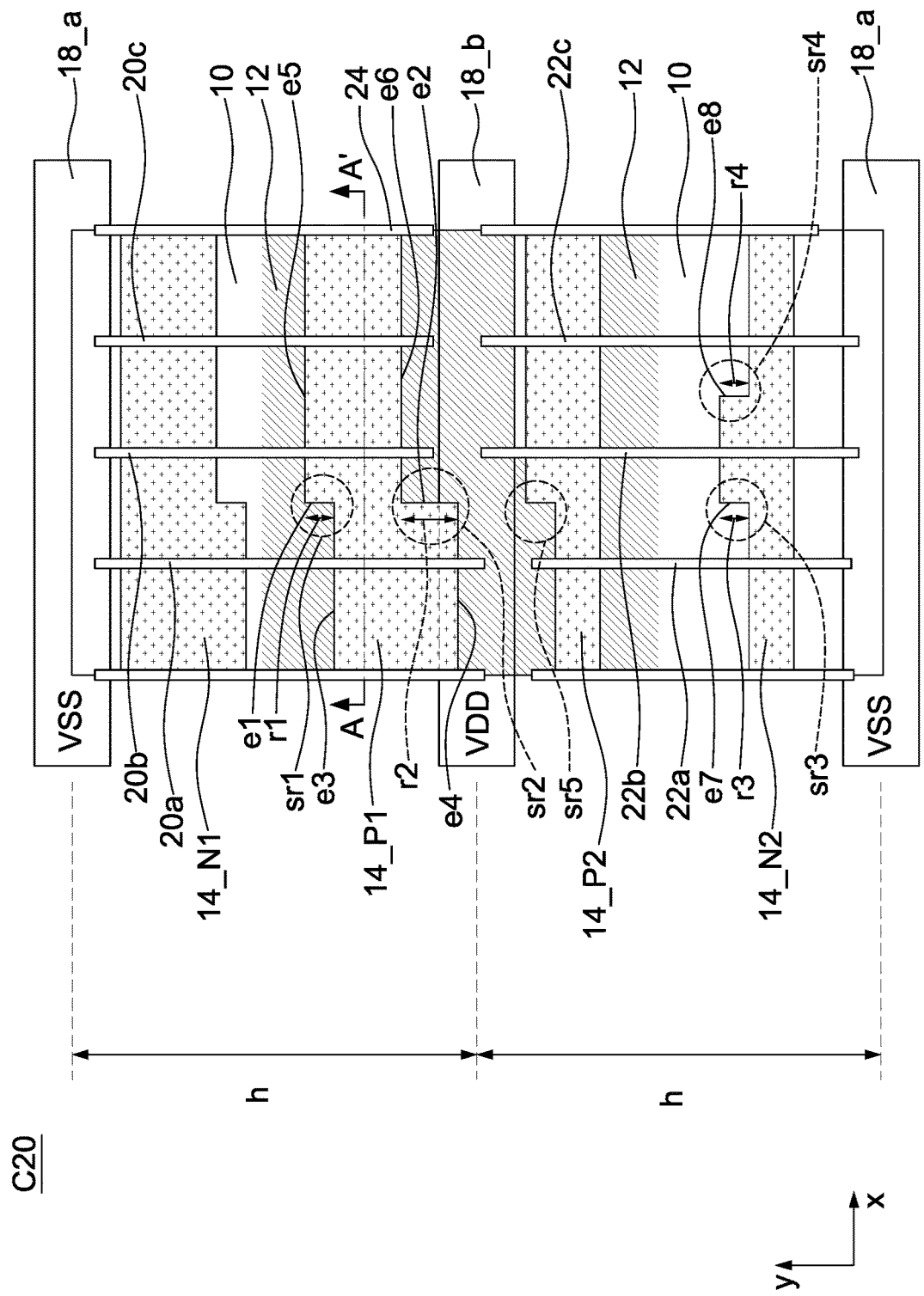
FIG. 2B illustrates a single cell in accordance with some embodiments.

FIG. 2B illustrates a single cell C20 in accordance with some embodiments that may be stored in the cell libraries 206. The cell C20 is a double-height cell with a height 2h. The cell C20 includes a substrate 10 and well regions 12. The cell C20 further includes active regions 14_N1, 14_N2, 14_P1 and 14_P2 on the substrate 10. Gate structures 20a, 20b, and 20c are disposed in parallel on the active regions 14_N1 and 14_P1. Gate structures 22a, 22b, and 22c are disposed in parallel on the active regions 14_N2 and 14_P2.

Several isolation structures 24 are disposed on the left and right sides the cell C20. Conductive patterns 18_a and 18_b are disposed horizontally. The conductive patterns 18_a and 18_b are configured to be electrically connected to power source(s) and to receive, for example, voltages VDD and VSS. The single cell C20 is a layout representation for a portion of a semiconductor device. The gate structures 20a, 20b, and 20c 22a, 22b, and 22c can also be referred to as gate patterns, and the isolation structures 24 can also be referred to as isolation patterns 24.

The materials and/or characteristics of the structures/patterns (e.g., the substrate 10, the well regions 12, the active regions 14_N1, 14_N2, 14_P1 and 14_P2, the gate structures 20a, 20b, 20c, 22a, 22b, and 22c, and the isolation patterns 24) of the cell C20 are similar to those of the cell C10, and thus the details are not repeated here.

Referring to FIG. 2B, the active region 14_P1 includes portions of different dimensions. In some embodiments, the active region 14_P1 includes two portions of different widths. The two portions of the active region 14_P1 define stair profiles sr1 and sr2. The stair profiles sr1 and sr2 can each be referred to as a step profile or a discontinuity profile.

The stair profile sr1 includes a rising edge e1 that connects two horizontal edges e3 and e5 of the active region 14_P1. In some embodiments, the rising edge e1 can be in the middle of two adjacent gate structures. In some embodiments, the distances between the rising edge e1 and its two neighboring gate structures are substantially the same.

The stair profile sr2 includes a rising edge e2 that connects two horizontal edges e4 and e6 of the active region 14_P1. In some embodiments, the rising edge e2 can be in the middle of two adjacent gate structures. In some embodiments, the rising edge e2 can be aligned with the rising edge e1.

The stair profile sr1 includes a rise r1 and the stair profile sr2 includes a rise r2. The rise r1 is the horizontal distance between edges e3 and e5, and the rise r2 is the horizontal distance between edges e4 and e6. In some embodiments, the rise r1 can be different from the rise r2. In some embodiments, the rise r1 can be substantially identical to the rise r2.

The active region 14_P2 includes portions of different dimensions. In some embodiments, the active region 14_P2 includes two portions of different widths. The two portions of the active region 14_P2 define a stair profile sr5.

The active region 14_N2 includes portions of different dimensions. In some embodiments, the active region 14_N2 includes three portions of different widths. The three portions of the active region 14_N2 define stair profiles sr3 and sr4. The stair profile sr3 includes a rising edge e7 that connects two horizontal edges of the active region 14_N2. In some embodiments, the rising edge e7 can be in the middle of two adjacent gate structures. In some embodiments, the distances between the rising edge e7 and its two neighboring gate structures are substantially the same. The stair profile sr4 includes a rising edge e8 that connects two horizontal edges of the active region 14_N2. In some embodiments, the rising edge e8 can be in the middle of two adjacent gate structures. In some embodiments, the distances between the rising edge e8 and its two neighboring gate structures are substantially the same. The stair profile sr3 includes a rise r3 and the stair profile sr4 includes a rise r4. In some embodiments, the rise r3 can be substantially identical to the rise r4. Because of the stair profiles sr3 and sr4, the active region 14_N2 can be referred to as including a "U-shaped" portion.

Figure 2C:
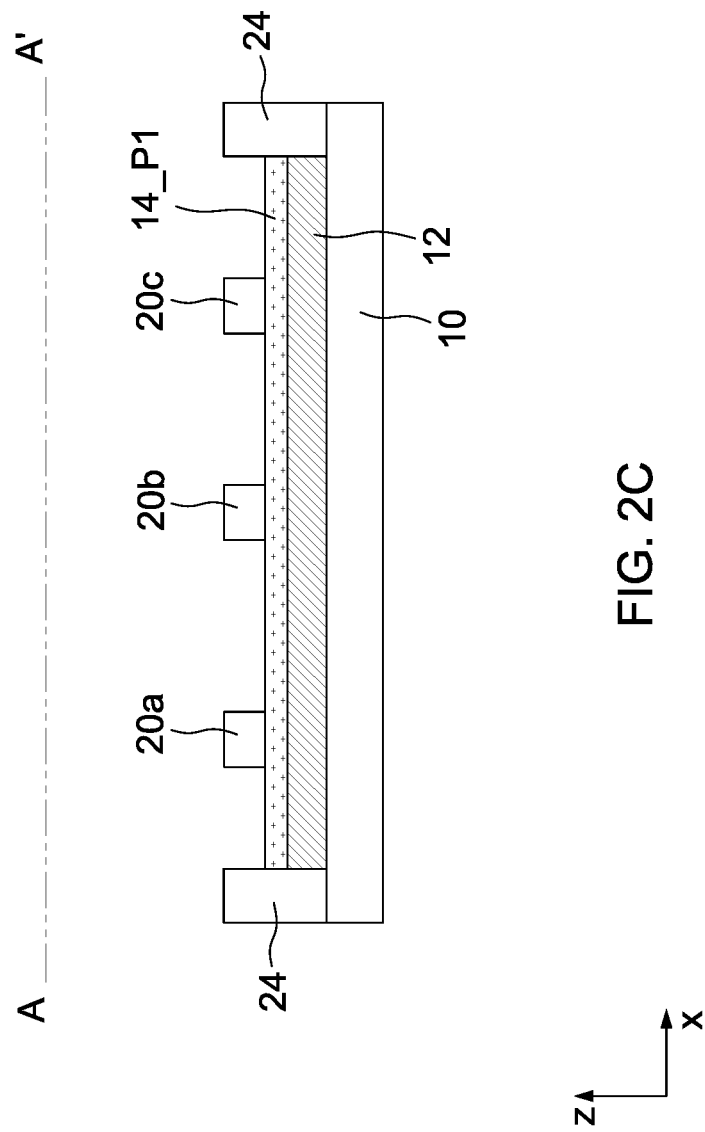
FIG. 2C is a cross section along the dashed line A-A' of FIG. 2B, in accordance with some embodiments.

FIG. 2C is a cross section along the dashed line A-A' of FIG. 2B, in accordance with some embodiments. The active region 14_P1 and the well region 12 are disposed in the substrate 10, and the active region 14_P1 is disposed above the well region 12. The gate structures 20a, 20b, and 20c are disposed on the active region 14_P1. In some embodiments, a layer of oxide material (not shown) can be disposed between each of the gate structures 20a, 20b, and 20c and the active region 14_P1. The isolation structures 24 are disposed on both sides of the well region 12. The isolation structures 24 are disposed on both sides of the active region 14_P1. The isolation structures 24 can isolate the cell C20 from its neighboring cells.

Figure 2D:
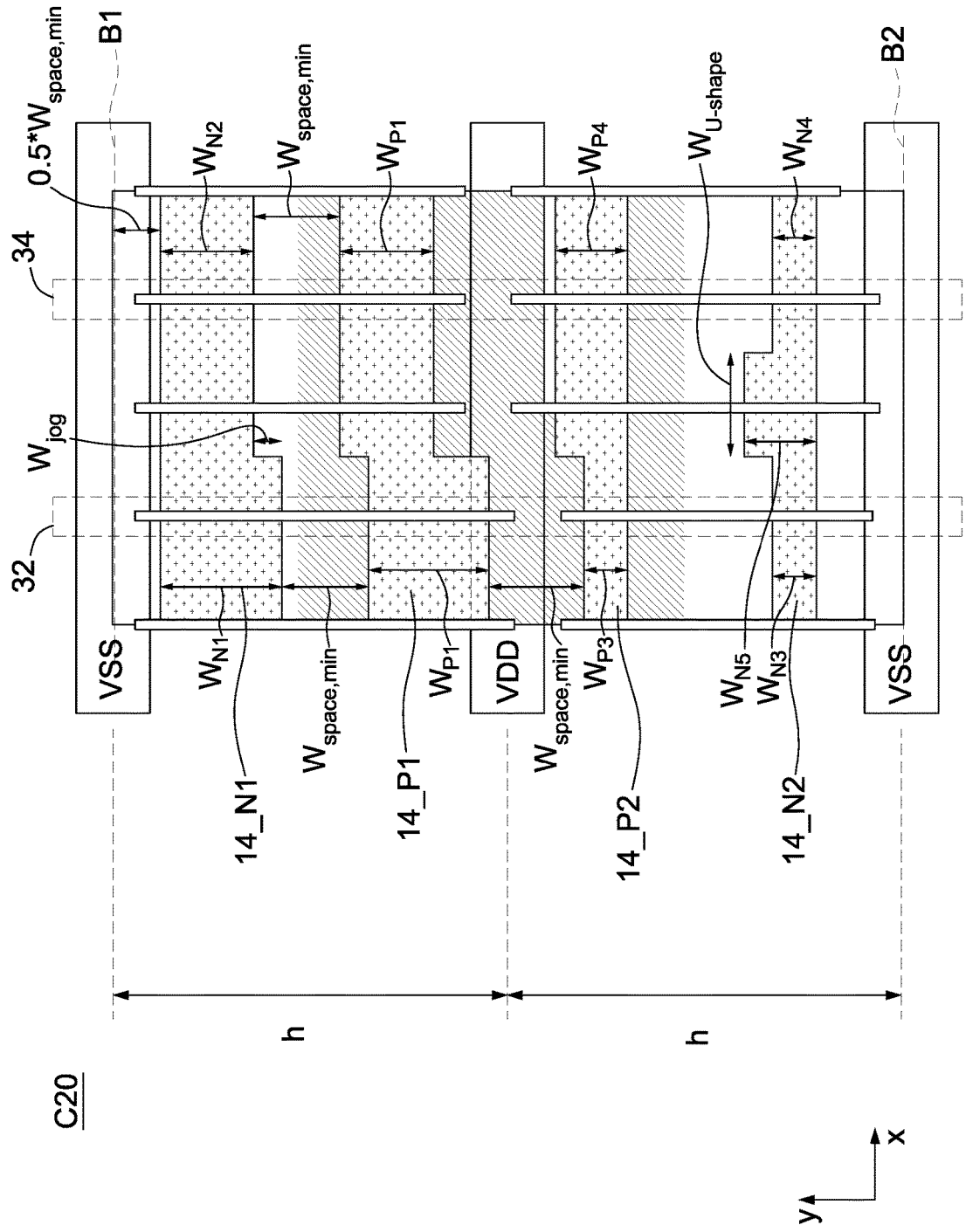
FIG. 2D illustrates a single cell in accordance with some embodiments.

FIG. 2D illustrates a single cell C20 in accordance with some embodiments that may be stored in the cell libraries 206. The cell C20 of FIG. 2D is identical to that of FIG. 2B. FIG. 2D provides details of some design rules for the cell C20.

Some comparisons between the cell C20 and a cell with uniform active regions can be made. For a single-height cell with uniform active regions (i.e., each of the active regions has a uniform width, without any stair profile), the width (e.g., along the Y-axis from the top view) of the active region is specified by a limit, for example, $W_{sh, max}$. As a comparison, for the cell C20 in the present disclosure, the maximum width of the active region can be greater than $W_{sh,\ max}$. In some embodiments, the widths $W_{N1}$ and $W_{P1}$ can be greater than $W_{sh,\ max}$. However, the minimum space between adjacent active regions is specified by a limit, for example, $W_{space,\ min}$, so as to avoid STI stress effects.

In addition, the total width of the active regions within a single cell along a single gate structure is specified by a limit. Referring to FIG. 2D, the total width of the active regions along the column 32 (i.e., the sum of $W_{N1}$, $W_{P1}$, $W_{N3}$ and $W_{P3}$) is specified by:

$$W_{N1}+W_{P1}+W_{P3}+W_{N3} \leq 4 \times W_{sh,max}$$

Similarly, the total width of the active regions along the column 34 (i.e., the sum of $W_{N2}$, $W_{P2}$, $W_{P4}$ and $W_{N4}$) is specified by:

$$W_{N2}+W_{P2}+W_{P4}+W_{N4} \leq 4 \times W_{sh,max}$$

Furthermore, the minimum space between an active region and the cell boundary is specified by a limit, for example, $0.5*W_{space,\ min}$. Referring to FIG. 2D, the minimum space between the active region 14_N1 and the cell boundary B1 of the cell C20 equals or exceeds $0.5*W_{space,\ min}$. Similarly, the minimum space between the active region 14_N2 and the cell boundary B2 of the cell C20 equals or exceeds $0.5*W_{space,\ min}$.

The dimensions of each pattern of the cell C20 are provided for reference. In some embodiments, the high of the cell C20 (i.e., 2 h) is approximate 130 nm. In some embodiments, the $W_{sh,\ max}$ is approximate 24 nm. In some embodiments, the $W_{space,\ min}$ is approximate 41 nm. In some embodiments, the $W_{jog}$ (i.e., the rise of a stair profile) is in a range of approximately 1 nm to 18 nm. In some embodiments, each of the widths $W_{N1}$, $W_{N2}$, $W_{N3}$ and $W_{N4}$ is in a range of approximately 13 nm to 31 nm. In some embodiments, each of the widths $W_{P1}$, $W_{P2}$, $W_{P3}$ and $W_{P4}$ is in a range of approximately 13 nm to 31 nm. In some embodiments, the distance between adjacent gate structures is in a range of approximately 45 nm to 54 nm. In some embodiments, the width $W_{U-shape}$ of the "U-shaped" portion of the active region 14_N2 is in a range of approximately 45 nm to 54 nm.

The dimensions provided are not meant to be limited, and it can be contemplated that these dimensions can be modified in accordance with actual design needs or be changed as the technologies evolve.

In some embodiments, up to four different widths of active regions can coexist in the cell C20. Referring to FIG. 2D, the active regions 14_P1 include two portions, one of width $W_{P1}$ and another with width $W_{P2}$, wherein the width $W_{P1}$ is greater than the width $W_{P2}$. In addition, the active regions 14_P2 includes two portions, one of width $W_{P3}$ and another with width $W_{P4}$, wherein the width $W_{P4}$ is greater than the width $W_{P3}$. Also, the width $W_{P2}$ is greater than the width $W_{P4}$. That is, The widths $W_{P1}$, $W_{P2}$, $W_{P3}$, and $W_{P4}$ are different.

In some embodiments, an active region can have more than two regions of different widths. Referring to FIG. 2D, the active region 14_N2 includes three portions of widths $W_{P3}$, $W_{N4}$, $W_{N5}$, respectively. In some embodiments, the widths $W_{P3}$, $W_{N4}$, and $W_{N5}$ are different from each other.

It can be contemplated that the cell C20 can design to include more than four different widths of active regions. In general, the dimensions of the active regions of a transistor may have influence on the performance (e.g., speed, power consumption, or current leakage) of the manufactured ICs. Therefore, a cell with four or more than four different widths of active regions can provide additional flexibility in the design of semiconductor devices.

Figure 3:
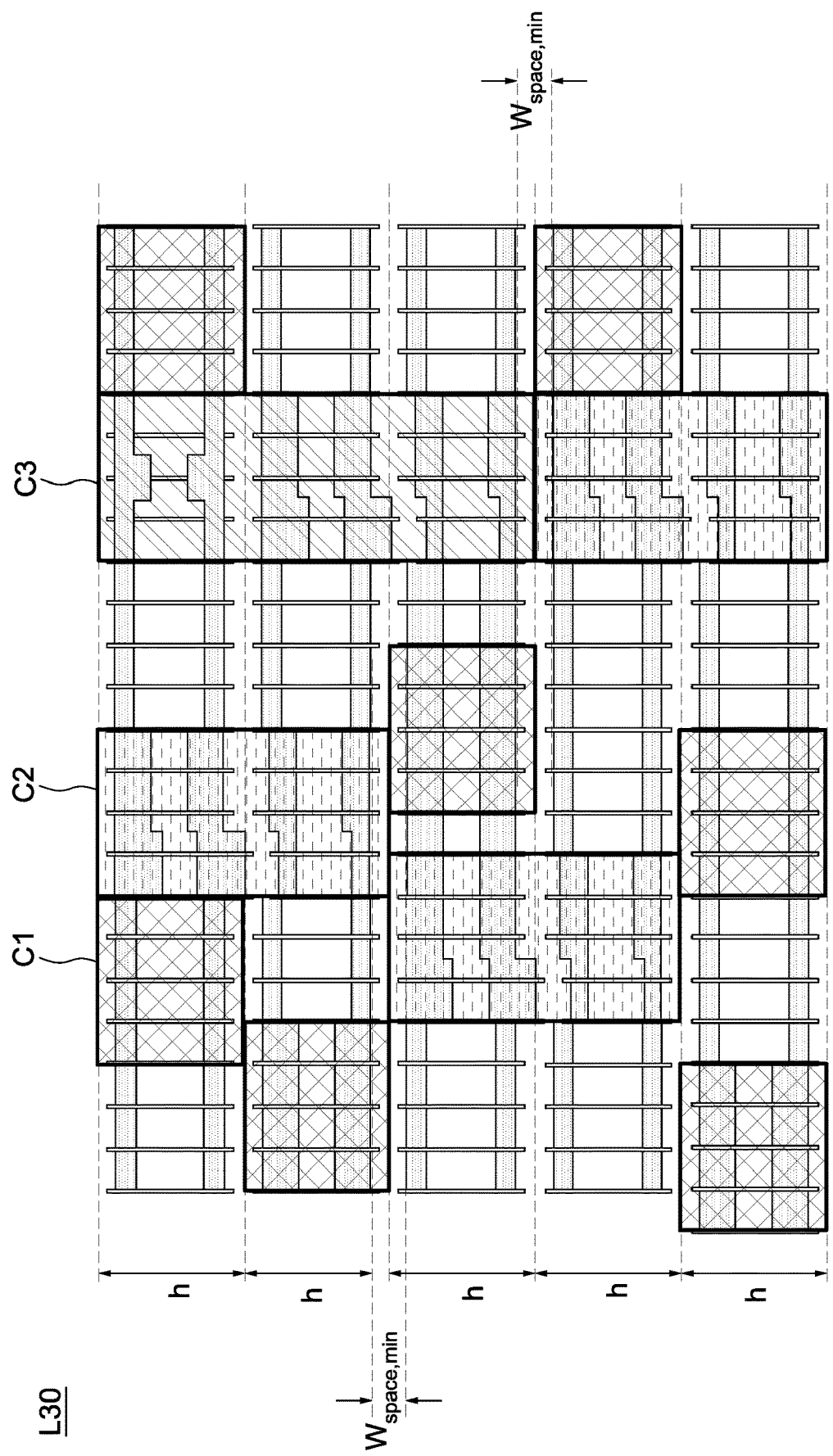
FIG. 3 illustrates a layout including multiple rows in accordance with some embodiments.

FIG. 3 illustrates a layout including multiple rows in accordance with some embodiments. The layout L30 of FIG. 3 includes five rows, each of a height h. In semiconductor manufacturing, cells with different heights can be variously utilized in layout designs. Referring to FIG. 3, the cell C1 has a height h, and can be referred to as a single-height cell. The cell C2 has a height 2h, and can be referred to as a double-height cell. The cell C3 has a height 3h, and can be referred to as a triple-height cell. The single-height cell C1 includes active regions of a uniform width. That is, the active regions of the single-height cell C1 do not include any stair profile. On the contrary, the active regions of the double-height cell C2 and the triple-height cell C3 may include one or more stair profiles.

Referring to FIG. 3, the active regions of two adjacent cells along a longitudinal orientation will be spaced apart by at least a distance $W_{space,\ min}$, so as to avoid STI stress.

Figure 4A:
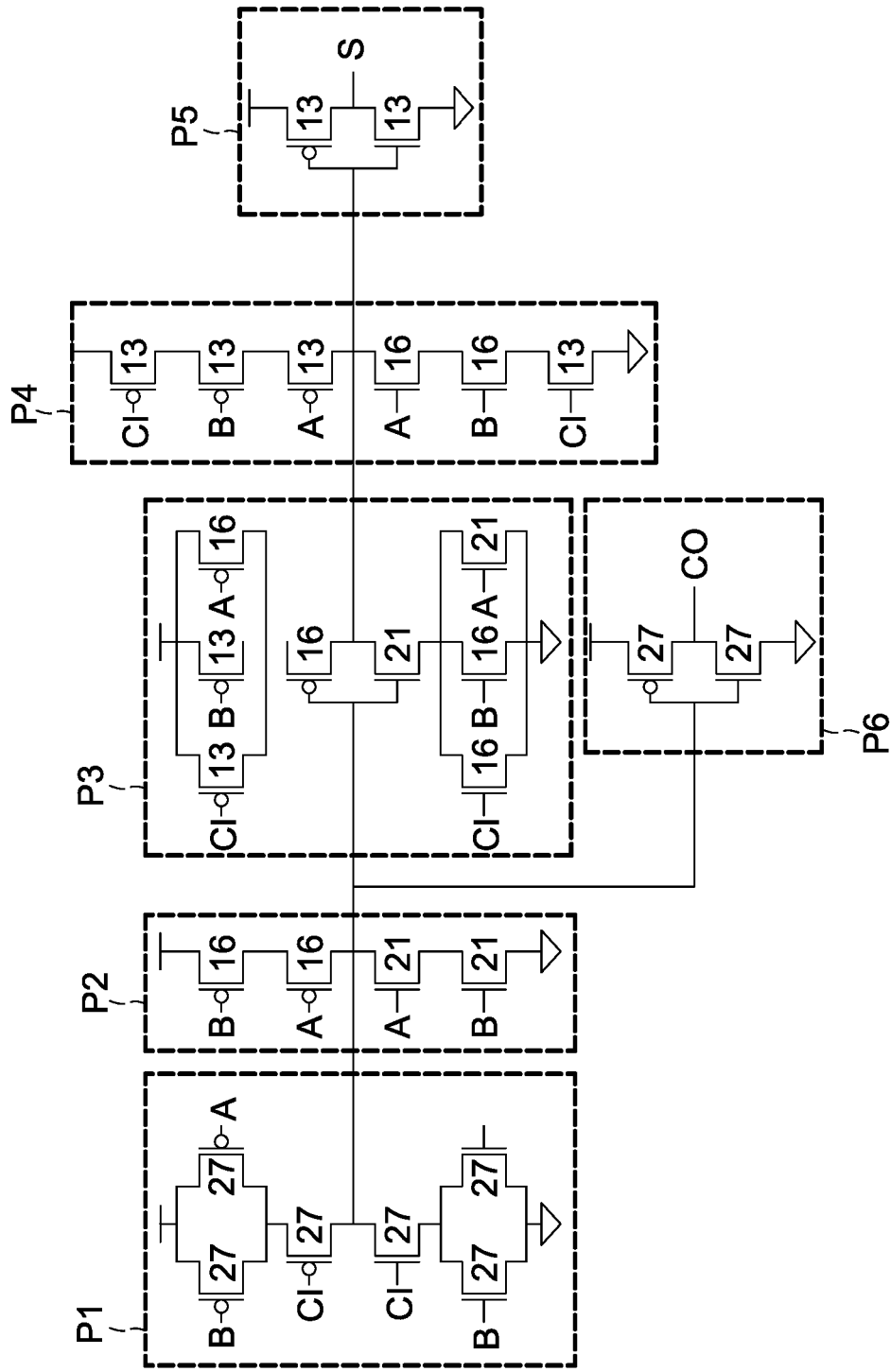
FIG. 4A is a circuit diagram of a full adder in accordance with some embodiments.

FIG. 4A is a circuit diagram of a full adder in accordance with some embodiments. The circuit diagram D40 of FIG. 4A is a full adder comprising a plurality of transistors. The plurality of transistors can be grouped into subsets P1, P2, P3, P4, P5, and P6 in accordance with function. The labels near the gate of each of the transistors indicate width of their active regions. In some embodiments, in the subset P1, the six transistors include an active region of a width 27 nm. In some embodiments, in the subset P2, two of the transistors include an active region of a width 16 nm, and the other two transistors include an active region of a width 21 nm. The subset P3 can include transistors of three different widths of active regions. The widths labeled on FIG. 4A are merely for the purpose of illustration, and thus it can be contemplated that active regions of widths different from those shown in FIG. 4A can be utilized in accordance with design needs. In general, a transistor manufactured with a greater active region usually has advantages of working speed and low latency. On the other hand, a transistor manufactured with a smaller active region usually have advantages in power consumption and low leakage. The transistors in the subsets P1, P2, P3, P4, P5, and P6 can be flexibly designed with appropriate active region width, and thus the full adder manufactured in accordance with the circuit diagram D40 can have advantages in performance (e.g., speed, power consumption, and current leakage).

Figure 4B:
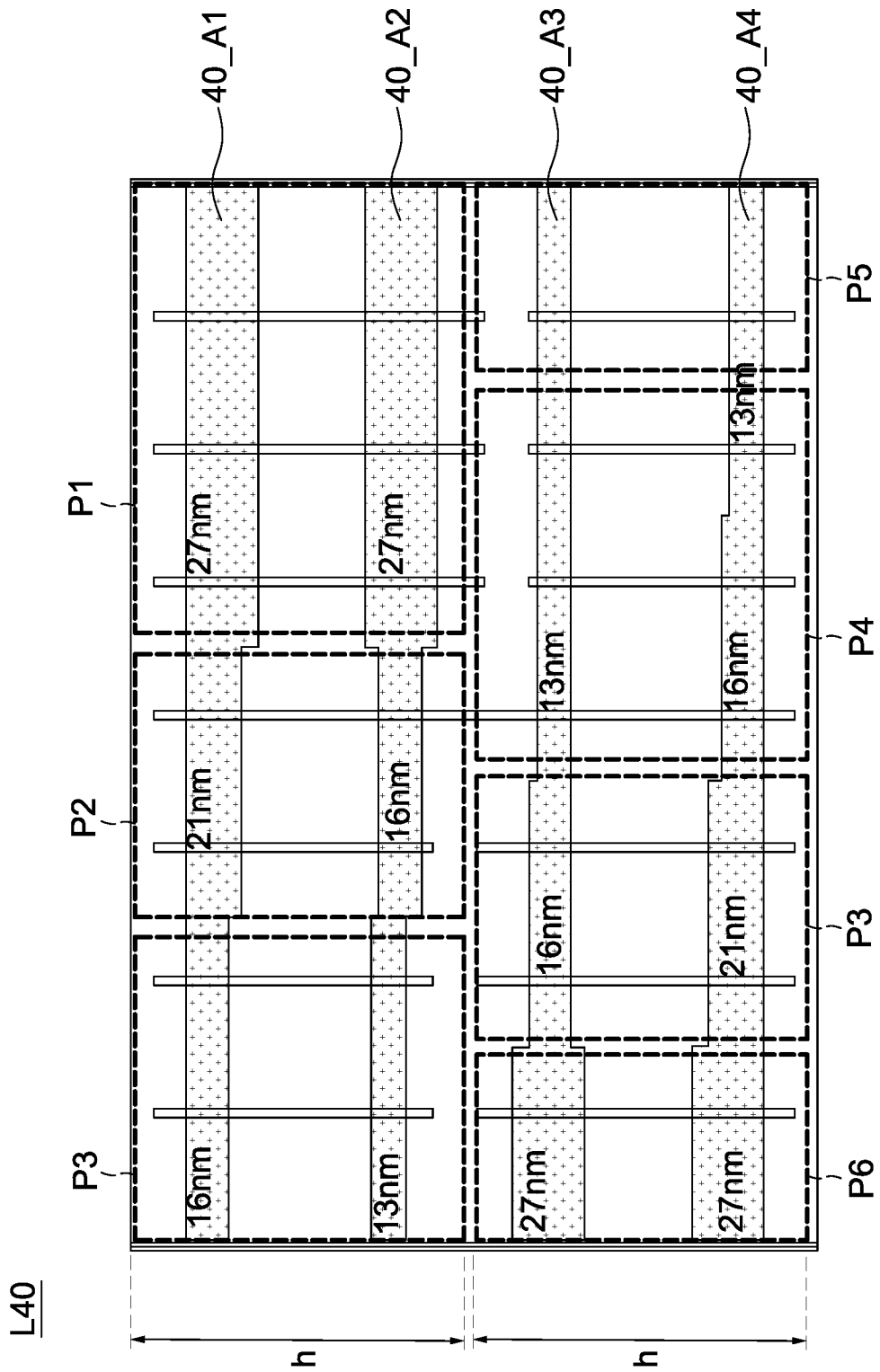
FIG. 4B illustrates a layout of a full adder in accordance with some embodiments.

FIG. 4B illustrates a layout of a full adder in accordance with some embodiments. FIG. 4B shows a layout L40 of a full adder. The layout L40 corresponds to the circuit diagram D40 of FIG. 4A. The layout L40 includes two rows, each of a height h. The subsets P1, P2, P3, P4, P5, and P6 of the full adder can be arranged as shown in FIG. 4B. The layout L40 includes active regions 40_A1, 40_A2, 40_A3, and 40_A4. The active regions 40_A1, 40_A2, and 40_A3 each includes three portions of different widths. The active region 40_A4 includes four portions of different widths.

Figure 5A:
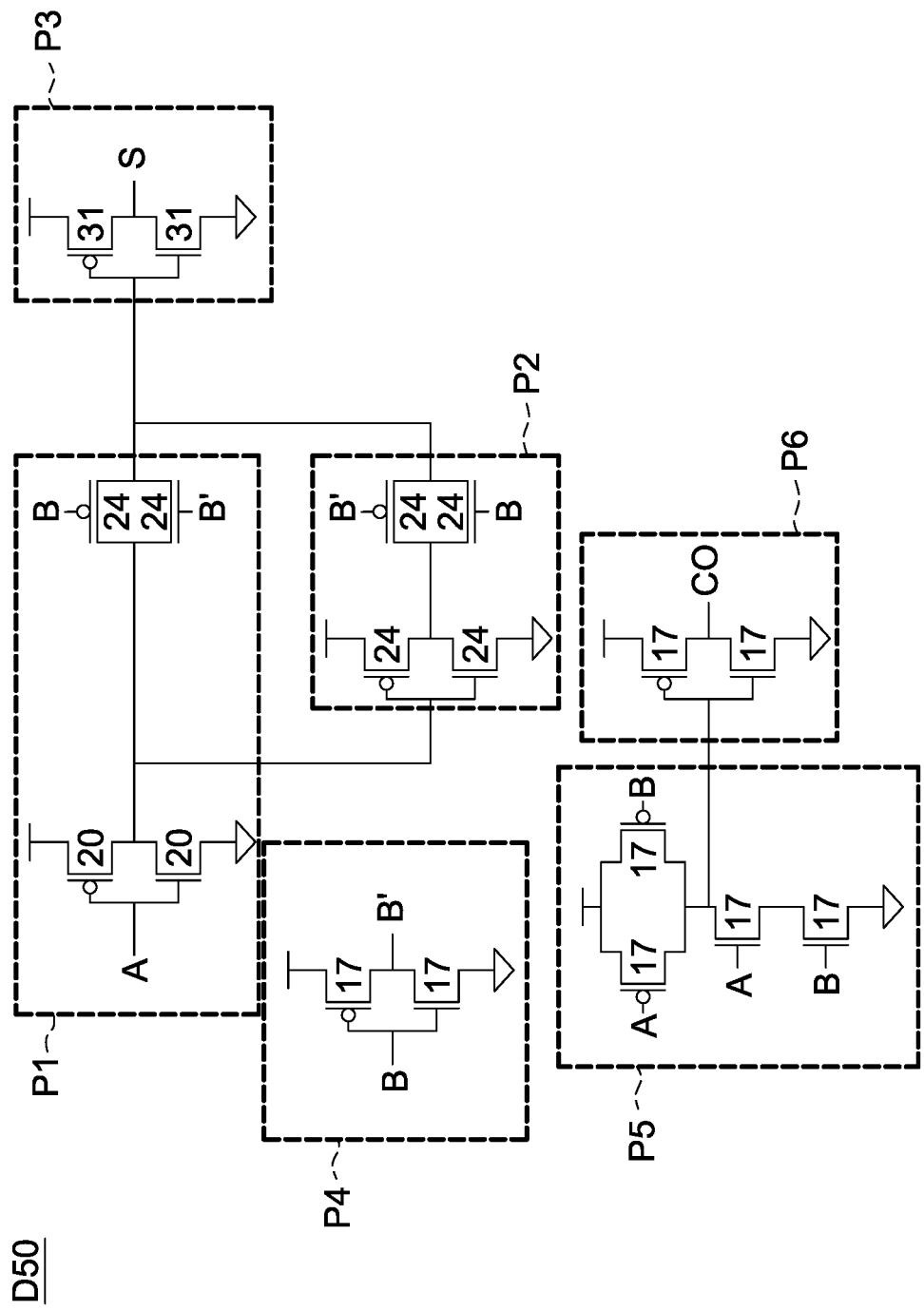
FIG. 5A is a circuit diagram of a half adder in accordance with some embodiments.

FIG. 5A is a circuit diagram of a half adder in accordance with some embodiments. The circuit diagram D50 of FIG. 5A is a half adder comprising a plurality of transistors. The plurality of transistors can be grouped into subsets P1, P2, P3, P4, P5, and P6 in accordance with their functions. The labels near the gate of each of the transistors indicate the width of their active regions. In some embodiments, in the subset P1, two transistors include an active region of a width 20 nm, and two transistors include an active region of a width 24 nm. In some embodiments, in the subset P2, the four transistors include an active region of a width 24 nm. The widths labeled on FIG. 5A are merely for the purpose of illustration, and thus it can be contemplated that active regions of widths different from those shown in FIG. 5A can be utilized in accordance with design needs. In general, a transistor manufactured with a greater active region usually has advantages of working speed and low latency. On the other hand, a transistor manufactured with a smaller active region usually has advantages of power consumption and low current leakage. The transistors in the subsets P1, P2, P3, P4, P5, and P6 can be flexibly designed with appropriate active region width, and thus the half adder manufactured in accordance with the circuit diagram D50 can have advantages in performance (e.g., speed, power consumption, and current leakage).

Figure 5B:
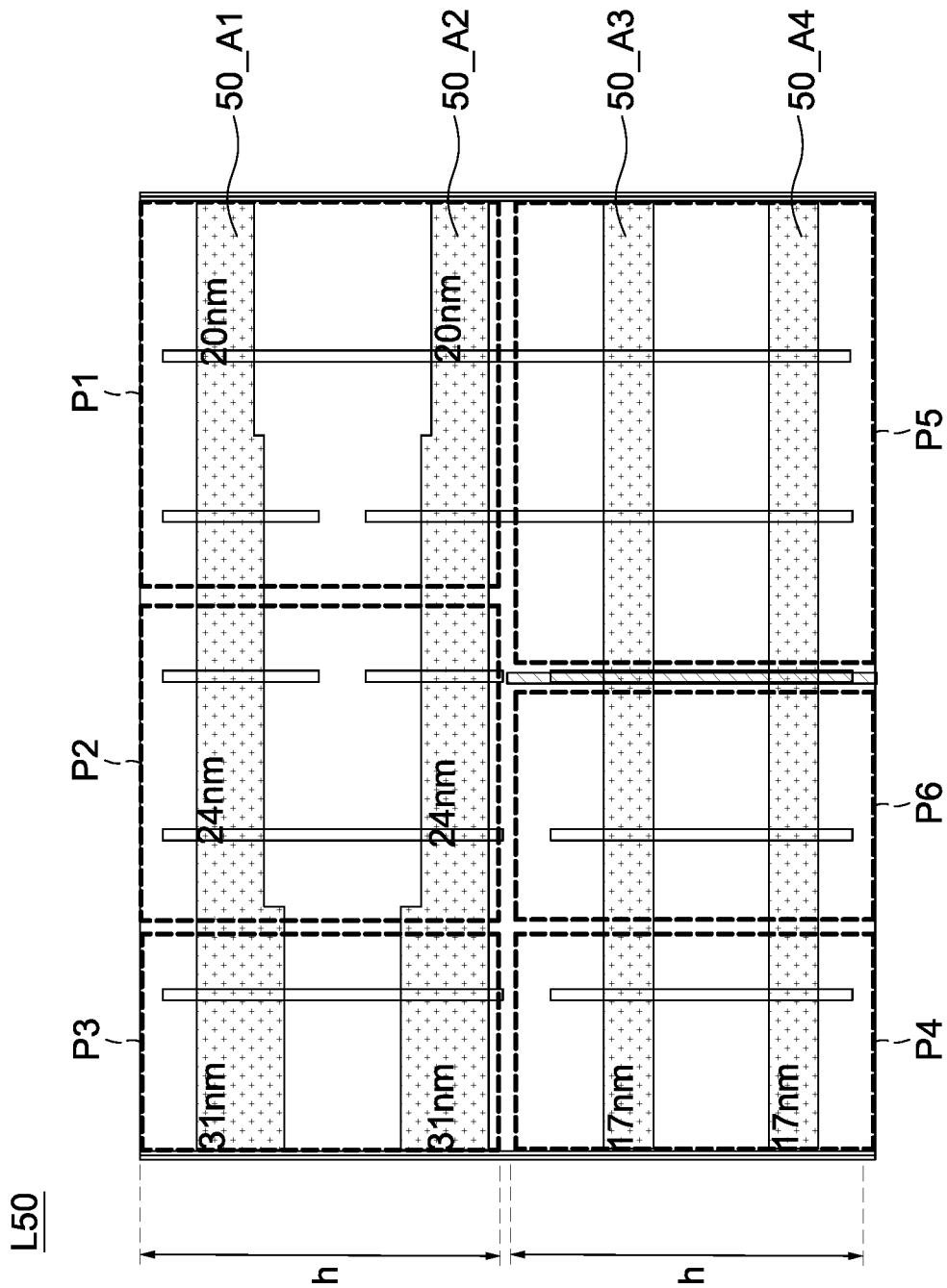
FIG. 5B illustrates a layout of a half adder in accordance with some embodiments.

FIG. 5B illustrates a layout of a half adder in accordance with some embodiments. FIG. 5B shows a layout L50 of a full adder. The layout L50 correspond to the circuit diagram D50 of FIG. 5A. The layout L50 includes two rows, each of a height h. The subsets P1, P2, P3, P4, P5, and P6 of the half adder can be arranged as shown in FIG. 5B. The layout L50 includes active regions 50_A1, 50_A2, 50_A3, and 50_A4. The active regions 50_A1 and 50_A2 each includes three portions of different widths. The active regions 50_A3 and 50_A4 each has a uniform width.

Figure 6A:
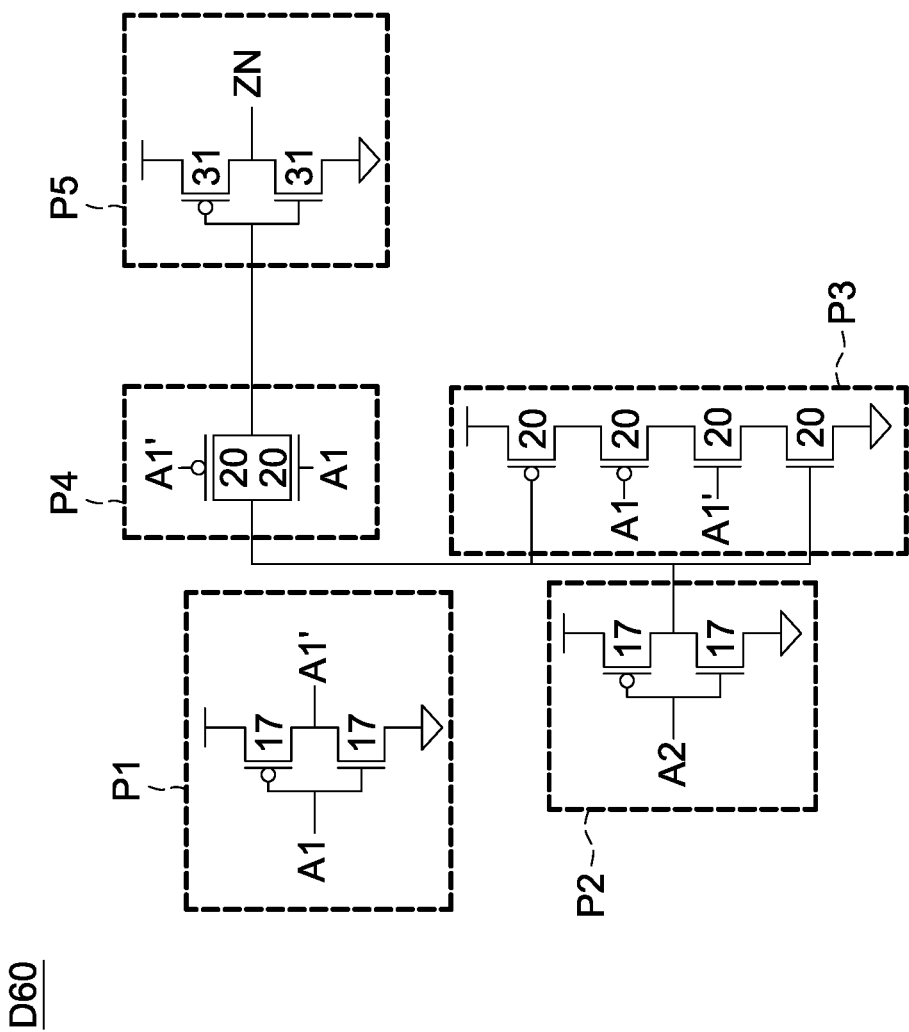
FIG. 6A is a circuit diagram of an exclusive NOR in accordance with some embodiments.

FIG. 6A is a circuit diagram of an exclusive NOR in accordance with some embodiments. The circuit diagram D60 of FIG. 6A is an exclusive NOR comprising a plurality of transistors. The plurality of transistors can be grouped into subsets P1, P2, P3, P4, and P5 in accordance with their functions. The labels near the gate of each of the transistors indicate the width of their active regions. In some embodiments, in the subset P1, the two transistors include an active region of a width 17 nm. In some embodiments, in the subset P2, the two transistors include an active region of a width 17 nm. In some embodiments, in the subset P3, the four transistors include an active region of a width 20 nm. The widths labeled on FIG. 6A are merely for the purpose of illustration, and thus it can be contemplated that active regions of widths different from those shown in FIG. 6A can be utilized in accordance with design needs. In general, a transistor manufactured with a greater active region usually has advantages of working speed and low latency. On the other hand, a transistor manufactured with a smaller active region usually has advantages of power consumption and low current leakage. The transistors in the subsets P1, P2, P3, P4, and P5 can be flexibly designed with appropriate active region width, and thus the exclusive NOR manufactured in accordance with the circuit diagram D60 can have advantages in performance (e.g., speed, power consumption, and current leakage).

Figure 6B:
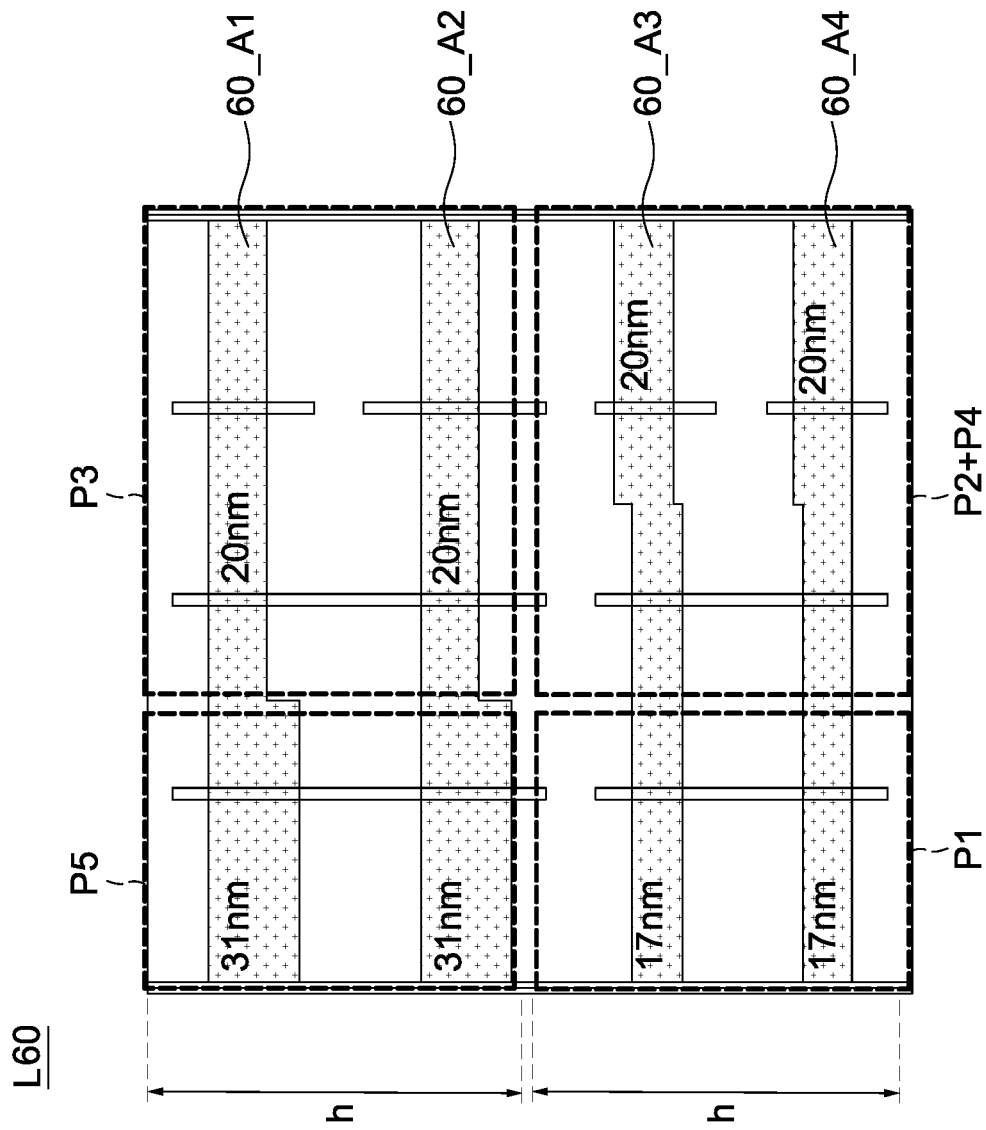
FIG. 6B illustrates a layout of an exclusive NOR in accordance with some embodiments.

FIG. 6B illustrates a layout of an exclusive NOR in accordance with some embodiments. FIG. 6B shows a layout L60 of an exclusive NOR. The layout L60 corresponds to the circuit diagram D60 of FIG. 6A. The layout L60 includes two rows, each of a height h. The subsets P1, P2, P3, P4, and P5 of the exclusive NOR can be arranged as shown in FIG. 6B. The layout L60 includes active regions 60_A1, 60_A2, 60_A3, and 60_A4. Each of the active regions 60_A1, 60_A2, 60_A3, and 60_A4 includes two portions of different widths.

Figure 7:
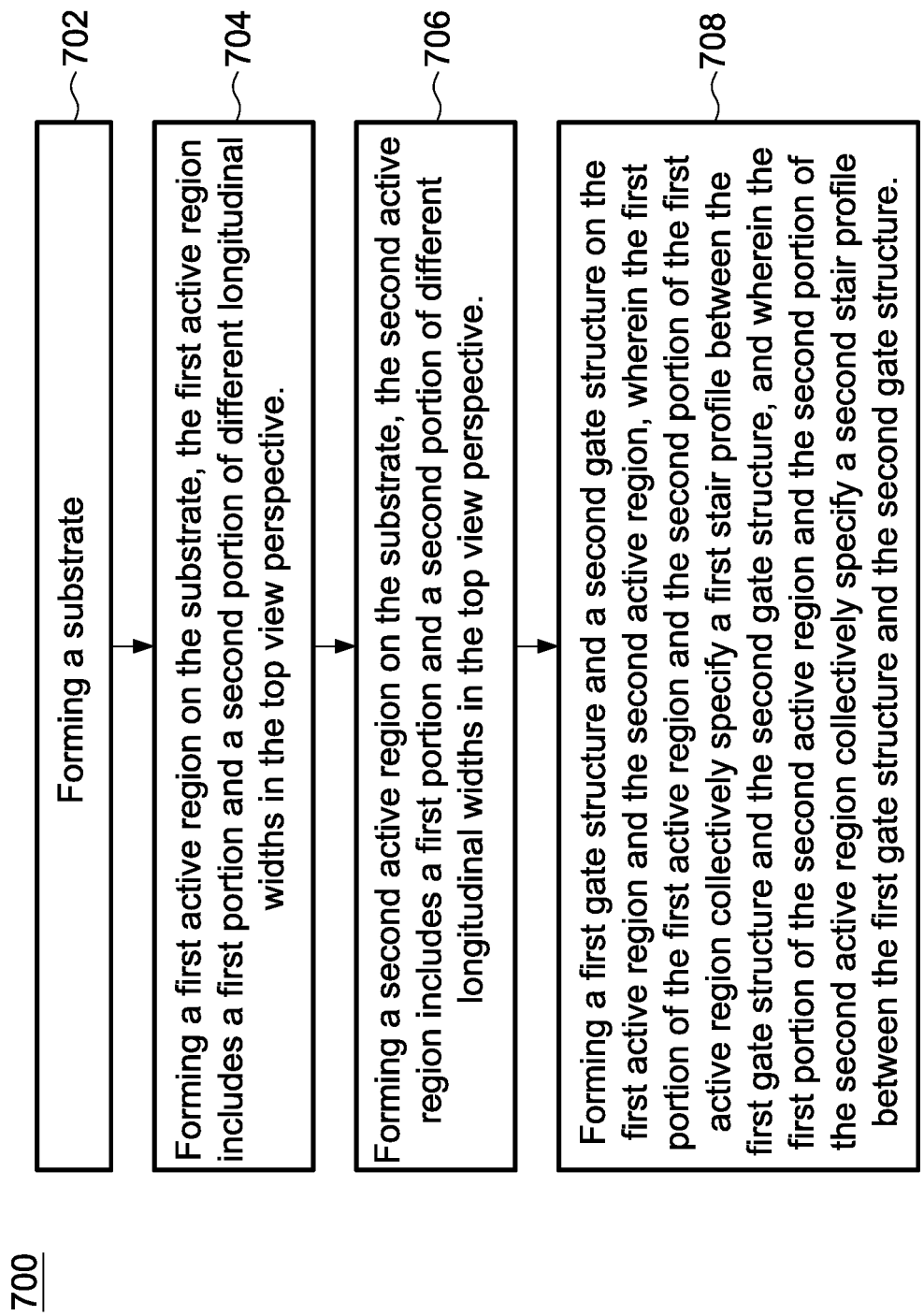
FIG. 7 is a flowchart of a method of manufacturing a semiconductor device, in accordance with some embodiments.

FIG. 7 is a flowchart of a method 700 of manufacturing a semiconductor device, in accordance with some embodiments. Method 700 is operable to form cells C10 or C20 discussed with respect to FIGS. 2A, 2B, and 2D.

In some embodiments, the operations of method 700 are performed in the order depicted in FIG. 7. In some embodiments, the operations of method 700 are performed in an order other than the order depicted in FIG. 7 and/or two or more operations of method 700 are performed simultaneously. In some embodiments, one or more additional operations are performed before, during, and/or after the operations of method 700. In some embodiments, performing some or all of the operations of method 700 includes performing one or more operations as discussed with respect to IC manufacturing system 800 and FIG. 8.

In operation 702, a substrate is formed. In operation 704, a first active region is formed on the substrate. The first active region includes a first portion and a second portion of different longitudinal widths from a top view. In some embodiments, the first active region may correspond to the active region 14_N1 of FIG. 2B. The active region 14_N1 includes two portions of different longitudinal widths from a top view.

In operation 706, a second active region is formed on the substrate. The second active region includes a first portion and a second portion of different longitudinal widths from a top view. In some embodiments, the second active region may correspond to the active region 14_P1 of FIG. 2B. The active region 14_P1 includes two portions of different longitudinal widths from a top view.

In operation 708, a first gate structure and a second gate structure are formed on the first active region and the second active region. In some embodiments, the first gate structure and the second gate structure formed may correspond to the gate structures 20a and 20b of FIG. 2B. The first portion of the first active region and the second portion of the first active region collectively specify a first stair profile between the first gate structure and the second gate structure. In some embodiments, two portions of the active region 14_N1 collectively specify a stair profile between the gate structures 20a and 20b.

The first portion of the second active region and the second portion of the second active region collectively specify a second stair profile between the first gate structure and the second gate structure. In some embodiments, two portions of the active region 14_P1 collectively specify a stair profile (i.e., sr1 or sr2) between the gate structures 20a and 20b.

By executing some or all of the operations of method 700, a semiconductor device is built that includes some or all of the features discussed with respect to cells C10 or C20, thereby obtaining the benefits discussed.

Figure 8:
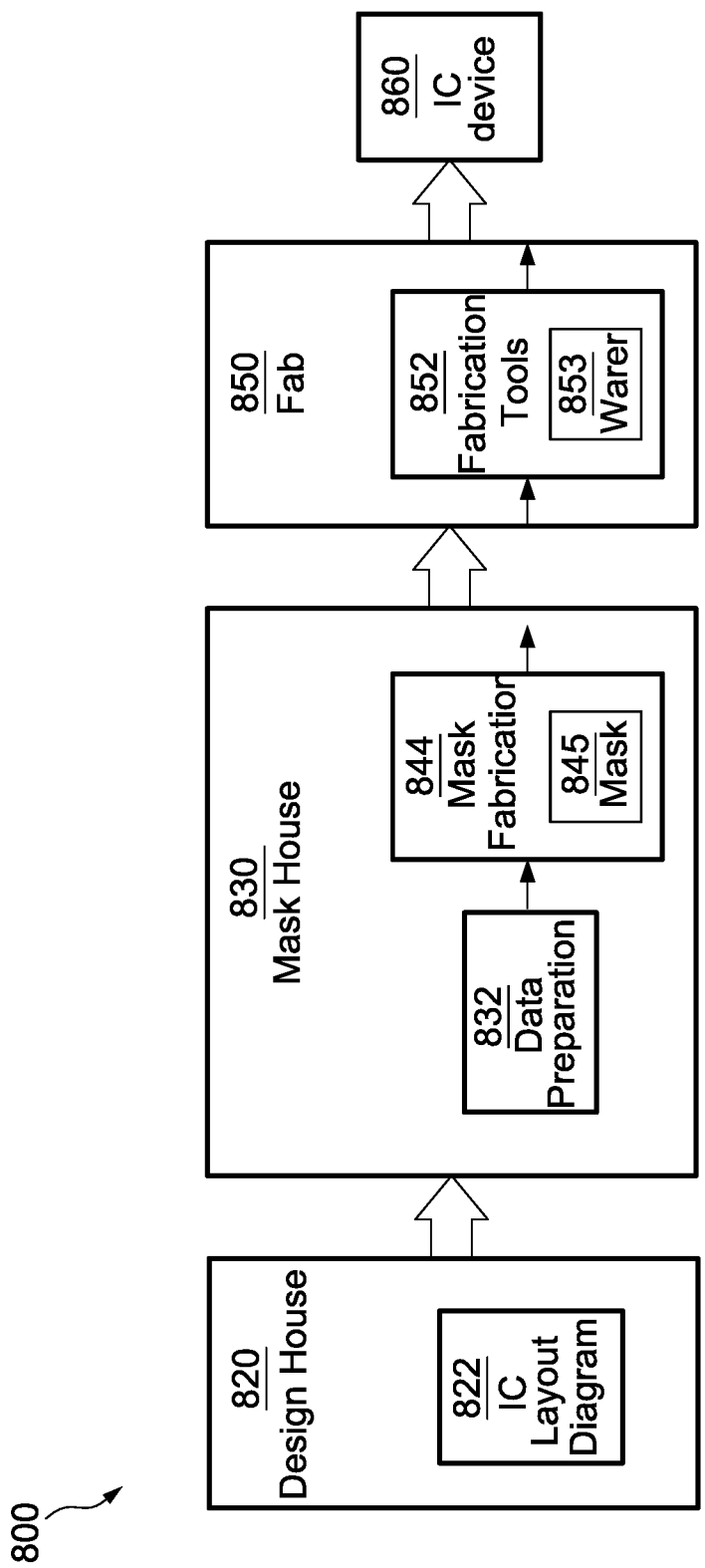
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometric patterns, e.g., an IC layout diagram including the MOM cells discussed here. The geometric patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometric patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the description of mask data preparation 832 has been simplified for clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication facility that includes one or more manufacturing facilities for the fabrication of a variety of different IC products. In some embodiments, IC Fab 850 is a semiconductor foundry. For example, there may be a manufacturing facility for the front-end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 86). In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

According to some embodiments, a semiconductor device is provided. The semiconductor device includes a substrate, a first active region disposed on the substrate, a first gate structure disposed on the first active region, and a second gate structure disposed on the first active region and spaced apart from the first gate structure. The first active region includes a first portion and a second portion, the first portion of the first active region and the second portion of the first active region collectively specify a first stair profile. The first stair profile is located between the first gate structure and the second gate structure from a top view.

According to some embodiments, a semiconductor device is provided. The semiconductor device includes a substrate, a first active region disposed on the substrate, and a second active region disposed on the substrate. The first active region includes a first portion and a second portion, and the second active region includes a first portion and a second portion. The first portion of the first active region includes a first width in a first orientation (y-axis) and the second portion of the first active region includes a second width in the first orientation (y-axis). The first portion of the second active region includes a third width in the first orientation (y-axis) and the second portion of the second active region includes a fourth width in the first orientation (y-axis). Wherein the first width, the second width, the third width, and the fourth width are different.

According to other embodiments, a method of manufacturing a semiconductor device is provided. The method comprises forming a substrate and forming a first active region on the substrate. The method further comprises forming a first gate structure and a second gate structure on the first active region. Wherein the first active region includes a first portion and a second portion of different longitudinal widths from a top view. Wherein the first portion of the first active region and the second portion of the first active region collectively specify a first stair profile between the first gate structure and the second gate structure.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
   a substrate;
   a first active region disposed on the substrate;
   a second active region disposed on the substrate;
   a first gate structure disposed on the first active region; and
   a second gate structure disposed on the first active region and spaced apart from the first gate structure, wherein
   the first active region includes a first portion and a second portion,
   the first portion of the first active region and the second portion of the first active region collectively specify a first stair profile;
   the first stair profile is located between the first gate structure and the second gate structure from a top view; and
   a third active region having a fourth stair profile and a fifth stair profile, wherein a distance between a rising edge of the fourth stair profile and a rising edge of the fifth stair profile is equal to that between two adjacent gate structures.

2. The semiconductor device of claim 1, wherein the first portion of the first active region includes a first width in a first orientation and the second portion of the first active region includes a second width in the first orientation, and wherein the first width is greater than the second width.

3. The semiconductor device of claim 1, wherein the first portion of the first active region and the second portion of the first active region collectively specify a second stair profile located between the first gate structure and the second gate structure from a top view.

4. The semiconductor device of claim 3, wherein the first stair profile includes a first rise and the second stair profile includes a second rise different from the first rise.

5. The semiconductor device of claim 3, wherein:
   the second active region and the third active region are disposed on different sides of the first active region from a top view.

6. The semiconductor device of claim 5, wherein the first stair profile faces the second active region and the second stair profile faces the third active region.

7. The semiconductor device of claim 5, further comprising a fourth active region including a first portion and a second portion, the first portion of the fourth active region includes a third width in the first orientation and the second portion of the fourth active region includes a fourth width in the first orientation, and wherein the fourth width is greater than the third width.

8. The semiconductor device of claim 7, wherein the fourth active region includes a first portion and a second portion, the first portion of the fourth active region includes a third width in the first orientation and the second portion of the fourth active region includes a fourth width in the first orientation, and wherein the first width, the second width, the third width, and the fourth width are different.

9. The semiconductor device of claim 1, further comprising:
a third gate structure disposed on the first active region;
wherein the fourth stair profile and the fifth stair profile are located on different sides of the third gate structure.

10. The semiconductor device of claim 9, further comprising a fourth gate structure and a fifth gate structure disposed on different sides of the third gate structure, wherein the fourth stair profile are located between the third gate structure and the fourth gate structure, and the fifth stair profile are located between the third gate structure and the fifth gate structure.

11. A semiconductor device, comprising:
a substrate;
a first active region disposed on the substrate;
a second active region disposed on the substrate, wherein the first active region includes a first portion and a second portion, and the second active region includes a first portion and a second portion;
the first portion of the first active region includes a first width in a first orientation and the second portion of the first active region includes a second width in the first orientation;
the first portion of the second active region includes a third width in the first orientation and the second portion of the second active region includes a fourth width in the first orientation;
the first width, the second width, the third width, and the fourth width are different; and
a third active region having a fourth stair profile and a fifth stair profile, wherein a distance between a rising edge of the fourth stair profile and a rising edge of the fifth stair profile is equal to that between two adjacent gate structures.

12. The semiconductor device of claim 11, wherein the first portion of the first active region and the second portion of the first active region collectively specify a first stair profile, and wherein the first stair profile is located between two adjacent gate structures.

13. The semiconductor device of claim 12, wherein the first portion of the first active region and the second portion of the first active region collectively specify a second stair profile, wherein the second stair profile is located between two adjacent gate structures, and wherein the first stair profile and the second stair profile are located on different sides of the first active region.

14. The semiconductor device of claim 11, wherein the first portion of the second active region and the second portion of the second active region collectively specify a third stair profile, and wherein the third stair profile is located between two adjacent gate structures.

15. The semiconductor device of claim 12, wherein the first stair profile includes a rising edge located in the middle of the two adjacent gate structures.

16. The semiconductor device of claim 13, wherein the second stair profile includes a rising edge located in the middle of the two adjacent gate structures.

17. The semiconductor device of claim 11, wherein a first distance between the first portion of the first active region and the first portion of the second active region is greater than a distance, and a second distance between the second portion of the first active region and the second portion of the second active region is greater than the distance.

18. A semiconductor device, comprising:
a substrate;
a first active region disposed on the substrate;
a second active region disposed on the substrate;
a first gate structure disposed on the first active region; and
a second gate structure disposed on the first active region and spaced apart from the first gate structure, wherein the first active region includes a first portion and a second portion of different longitudinal widths from a top view;
the first portion of the first active region and the second portion of the first active region collectively specify a first stair profile, and wherein the first stair profile is located between the first gate structure and the second gate structure; and
a third active region having a fourth stair profile and a fifth stair profile, wherein a distance between a rising edge of the fourth stair profile and a rising edge of the fifth stair profile is equal to that between two adjacent gate structures.

19. The semiconductor device of claim 18, further comprising:
a second active region disposed on the substrate; and
the second active region includes a first portion and a second portion of different longitudinal widths from the top view, and
wherein the first portion of the second active region and the second portion of the second active region collectively specify a second stair profile, and wherein the second stair profile is located between the first gate structure and the second gate structure.

20. The semiconductor device of claim 18, wherein the first portion of the first active region includes a first width in a first orientation and the second portion of the first active region includes a second width in the first orientation, and wherein the first width is greater than the second width.

* * * * *